United States Patent
Li et al.

(10) Patent No.: US 12,113,046 B2
(45) Date of Patent: Oct. 8, 2024

(54) METHOD FOR PREPARING SEMICONDUCTOR DEVICE WITH WIRE BOND

(71) Applicant: NANYA TECHNOLOGY CORPORATION, New Taipei (TW)

(72) Inventors: Wei-Zhong Li, Taoyuan (TW); Yi-Ting Shih, New Taipei (TW); Chien-Chung Wang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/386,345

(22) Filed: Nov. 2, 2023

(65) Prior Publication Data

US 2024/0063175 A1 Feb. 22, 2024

Related U.S. Application Data

(63) Continuation of application No. 17/465,328, filed on Sep. 2, 2021, now Pat. No. 11,876,072.

(51) Int. Cl.
*H01L 23/00* (2006.01)

(52) U.S. Cl.
CPC ............ *H01L 24/85* (2013.01); *H01L 24/03* (2013.01); *H01L 24/05* (2013.01); *H01L 24/48* (2013.01); *H01L 2224/03831* (2013.01); *H01L 2224/04042* (2013.01); *H01L 2224/48824* (2013.01); *H01L 2224/85031* (2013.01); *H01L 2224/85359* (2013.01)

(58) Field of Classification Search
CPC .................... H01L 24/85; H01L 2224/48824
See application file for complete search history.

(56) References Cited

U.S. PATENT DOCUMENTS

| | | | | |
|---|---|---|---|---|
| 6,079,610 A | * | 6/2000 | Maeda | H01L 24/48 228/110.1 |
| 2011/0304030 A1 | * | 12/2011 | Yamada | H01L 23/5222 257/E23.002 |
| 2015/0279810 A1 | * | 10/2015 | Wong | H01L 24/85 257/666 |

* cited by examiner

*Primary Examiner* — Dale E Page
*Assistant Examiner* — Wilner Jean Baptiste
(74) *Attorney, Agent, or Firm* — Xuan Zhang

(57) ABSTRACT

A method for preparing a semiconductor device includes providing an integrated circuit die having a bond pad. The bond pad includes aluminum (Al). The method also includes etching a top portion of the bond pad to form a recess, and bonding a wire bond to the recess in the bond pad. The wire bond includes copper (Cu).

6 Claims, 20 Drawing Sheets

METHOD FOR PREPARING SEMICONDUCTOR DEVICE WITH WIRE BOND

CROSS-REFERENCE TO RELATED APPLICATION

This application is a continuation application of U.S. Non-Provisional application Ser. No. 17/465,328 filed Sep. 2, 2021, which is incorporated herein by reference in its entirety.

TECHNICAL FIELD

The present disclosure relates to a method for preparing a semiconductor device, and more particularly, to a method for preparing a semiconductor device with a wire bond.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, wafer level chip scale packaging (WLCSP) is widely used for its low cost and relatively simple processes. Furthermore, numerous manufacturing operations are implemented within such small semiconductor devices.

However, the manufacturing and integration of semiconductor devices involve many complicated steps and operations. An increase in the complexity of manufacturing and integration of semiconductor devices may cause deficiencies, such as short circuits between adjacent bond pads caused by splash issue (e.g., the aluminum (Al) splash issue) during the bonding process between the wire bonds and the bond pads. The splash issue is exacerbated as the size of the semiconductor device decreases. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device is provided. The method includes providing an integrated circuit die having a bond pad. The bond pad includes aluminum (Al). The method also includes etching a top portion of the bond pad to form a recess, and bonding a wire bond to the recess in the bond pad. The wire bond includes copper (Cu).

In an embodiment, a maximum width of the recess in the bond pad is greater than or equal to a maximum width of the wire bond in a cross-sectional view. In an embodiment, a maximum depth of the recess in the bond pad is less than or equal to half of a thickness of the bond pad. In an embodiment, before the recess is formed, the method further includes forming a first dielectric layer over the bond pad, forming a second dielectric layer over the first dielectric layer, and etching the first dielectric layer and the second dielectric layer using a first photoresist layer as a mask to form a first opening exposing the bond pad. In an embodiment, before the recess is formed, the method further includes forming a second photoresist layer over the first photoresist layer and extending into the first opening, wherein the second photoresist layer has a second opening exposing the bonding pad. In an embodiment, a bottom width of the first opening is greater than a bottom width of the second opening. In an embodiment, the method further includes etching the top portion of the bond pad to form the recess through the second opening.

In another embodiment of the present disclosure, a method for preparing a semiconductor device is provided. The method includes providing an integrated circuit die having a bond pad, and forming a first dielectric layer over the bond pad. The method also includes forming a second dielectric layer over the first dielectric layer, and etching the first dielectric layer and the second dielectric layer to form a first opening exposing a top surface area of the bond pad. The method further includes partially recessing the top surface area of the bond pad to form a concave depression, and bonding a wire bond to the concave depression.

In an embodiment, the top surface area of the bond pad exposed by the first opening is greater than an area of the concave depression from a top view. In an embodiment, a footprint of the concave depression is greater than or equal to a footprint of the wire bond. In an embodiment, the bond pad includes aluminum (Al), and the wire bond includes copper (Cu). In an embodiment, the first dielectric layer is made of an oxide, and the second dielectric layer is made of a nitride. In an embodiment, the method further includes forming a first photoresist layer over the second dielectric layer, wherein the first opening is formed by using the first photoresist layer as a mask. In addition, the method includes forming a second photoresist layer over the first photoresist layer before the concave depression is formed. In an embodiment, the second photoresist layer extends into the first opening to cover sidewalls of the first photoresist layer, sidewalls of the second dielectric layer, and sidewalls of the first dielectric layer, and the concave depression is formed by using the second photoresist layer as a mask.

In yet another embodiment of the present disclosure, a method for preparing a semiconductor device is provided. The method includes providing an integrated circuit die having a bond pad. The bond pad includes aluminum (Al). The method also includes forming a first dielectric layer over the bond pad, and forming a second dielectric layer over the first dielectric layer. The method further includes forming a first photoresist layer over the second dielectric layer, and etching the first dielectric layer and the second dielectric layer using the first photoresist layer as a mask to form an opening. In addition, the method includes forming a second photoresist layer over the first photoresist layer and extending into the opening, and etching the bond pad using the second photoresist layer as a mask to form a recess. The method also includes performing a bonding process to bond a wire bond to the recess of the bond pad. The wire bond includes copper (Cu).

In an embodiment, a top surface area of the bond pad exposed by the opening is partially covered by the second photoresist layer. In an embodiment, the method further includes removing the second photoresist layer before the wire bond is bonded to the recess. In an embodiment, a splash is formed around the wire bond and in the opening during the bonding process. In an embodiment, the splash is formed from the bond pad. In an embodiment, the splash does not extend above a top surface of the first photoresist layer.

Embodiments of a method for preparing a semiconductor device are provided in the disclosure. The method includes etching a bond pad (e.g., aluminum (Al) pad) to form a recess, and bonding a wire bond (e.g., copper (Cu) wire) to the recess. Since the bond pad is partially etched to reserve capacity for the splash (e.g., Al splash) formed during the bonding process, the splash may be controlled and may be prevented from electrically connecting with adjacent bond pads. This provides more margin for the bonding process. As a result, the size of the bond pads can be reduced, which creates more room for chip design, therefore, reduces chip sizes.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a partial top view illustrating the structure of FIG. 1 according to a comparative example, wherein FIG. 1 is taken along line A-A' in FIG. 2.

FIG. 4 is a partial top view illustrating the structure of FIG. 3 according to a comparative example, wherein FIG. 3 is taken along line A-A' in FIG. 4.

FIG. 15 is a partial top view illustrating the structure of FIG. 14 according to various embodiments of the present disclosure, wherein FIG. 14 is taken along line B-B' in FIG. 15.

FIG. 18 is a partial top view illustrating the structure of FIG. 17 according to various embodiments of the present disclosure, wherein FIG. 17 is taken along line B-B' in FIG. 18.

DETAILED DESCRIPTION

Figure 1:
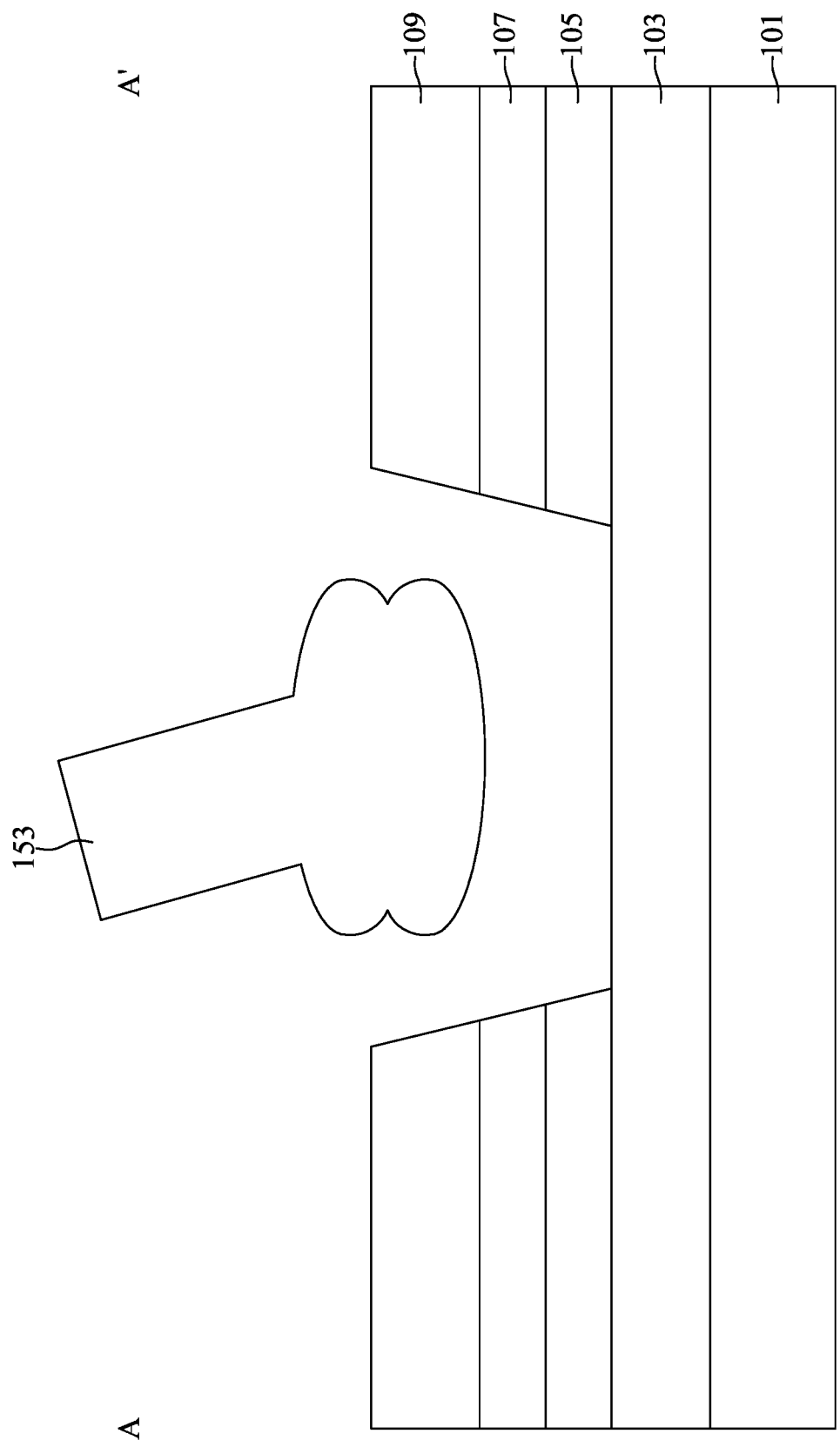
FIG. 1 is a cross-sectional view illustrating an intermediate stage of a process for forming a semiconductor device according to a comparative example.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
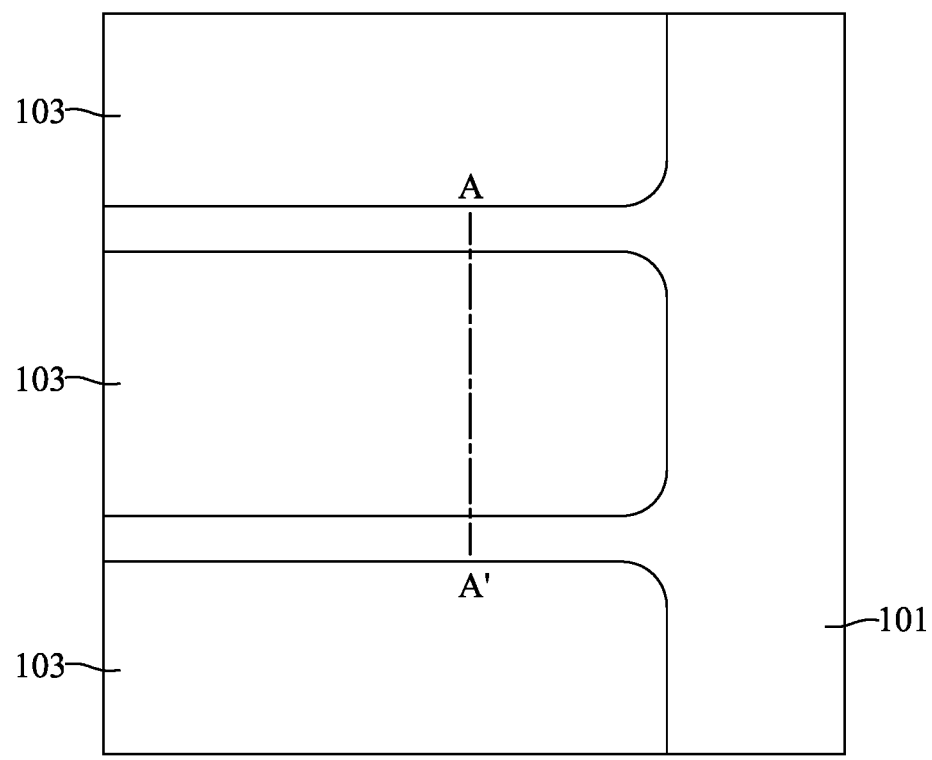
Figure 3:
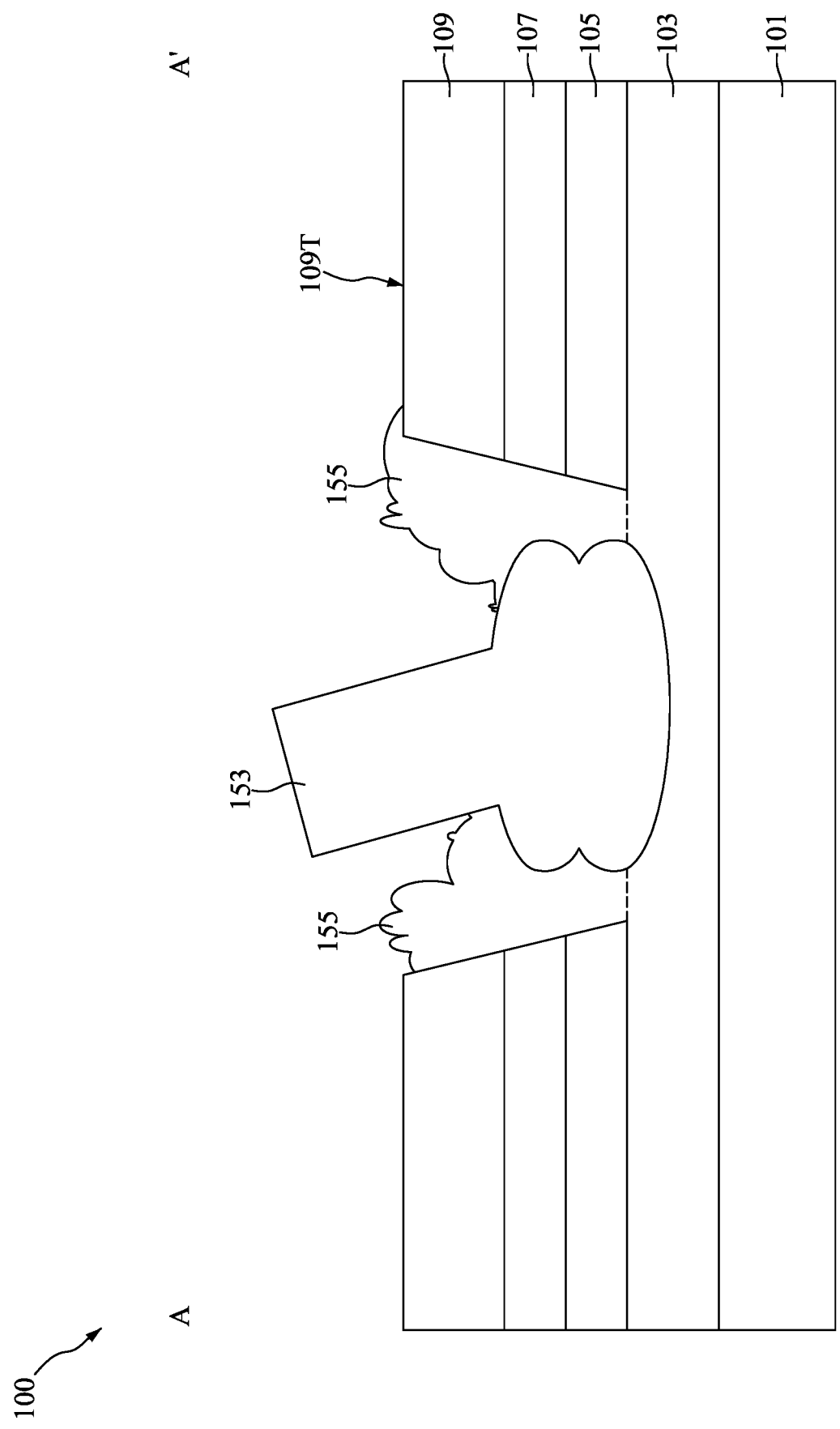
FIG. 3 is a cross-sectional view illustrating an intermediate stage of a process for forming a semiconductor device according to a comparative example.
Figure 4:
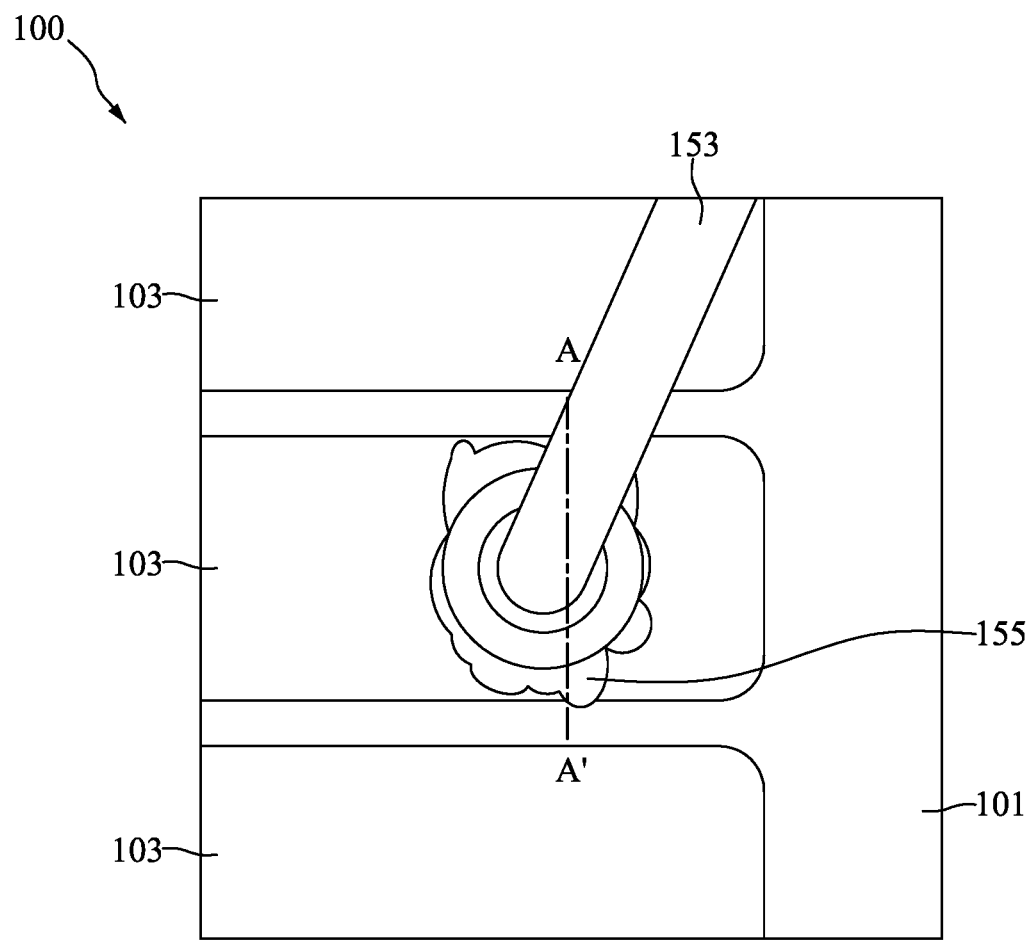

FIGS. 1 and 3 are cross-sectional views illustrating intermediate stages of a process for forming a semiconductor device 100 according to a comparative example, and FIGS. 2 and 4 are partial top views illustrating the structures of FIGS. 1 and 3, respectively. FIG. 1 is taken along line A-A' in FIG. 2, and FIG. 3 is taken along line A-A' in FIG. 4. Note that some layers shown in FIGS. 1 and 3 are not shown in the top views of FIGS. 2 and 4 in order to simplify the drawings.

In this comparative example, an integrated circuit die 101 with a bond pad 103 is provided, a dielectric layer 105 is disposed over the bond pad 103, another dielectric layer 107 is disposed over the dielectric layer 105, and a photoresist layer 109 is disposed over the dielectric layer 107. As shown in FIG. 1, a top surface area of the bond pad 103 is exposed by a bond pad opening penetrating through the dielectric layer 105, the dielectric layer 107 and the photoresist layer 109, and a wire bond 153 is aligned to the top surface area of the bond pad 103 exposed by the bond pad opening.

In this comparative example, the material of the bond pad 103 includes aluminum (Al), and the material of the wire bond 153 includes copper (Cu). Moreover, the integrated circuit die 101 has more than one bond pads 103 thereon, as shown in the partial top view of FIG. 2. Noted that the dielectric layer 105, the dielectric layer 107 and the photoresist layer 109 are not shown in FIG. 2 in order to simplify the drawing.

Next, as shown in FIGS. 3 and 4, the wire bond 153 is bonded to the top surface area of the bond pad 103 exposed by the bond pad opening in the dielectric layer 105, the dielectric layer 107 and the photoresist layer 109, and a splash 155 is formed around the wire bond 153 and in the bond pad opening. The splash 155 further extends over the top surface 109T of the photoresist layer 109. The splash 155 is formed from the material of the bond pad 103.

For example, when the wire bond 153 is bonded to the bond pad 103, the rubbing of the wire bond 153 against the bond pad 103 heats the material (e.g., Al) of the bond pad 103 and causes it to splash. In this comparative example, the material of the bond pad 103 splashes outside of the bond pad opening, such as onto the top surface 109T of the photoresist layer 109, which can cause a short circuit with an adjacent bond pad 103. In addition, the dielectric layer 105, the dielectric layer 107 and the photoresist layer 109 are not shown in FIG. 4 in order to simplify the drawing.

Figure 5:
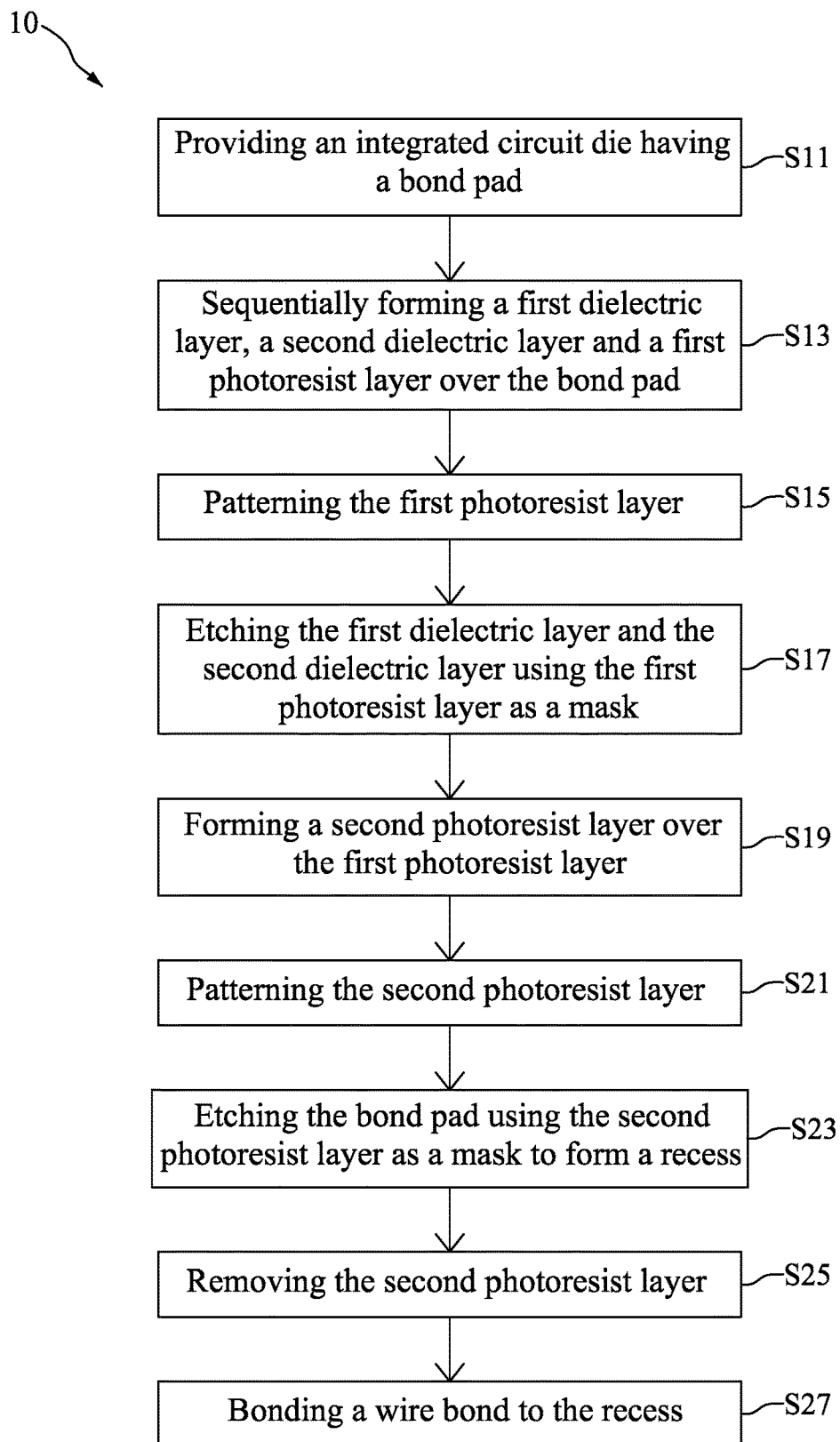
FIG. 5 is a flow diagram illustrating a method for preparing a semiconductor device according to various embodiments of the present disclosure.

FIG. 5 is a flow diagram illustrating a method 10 for forming a semiconductor device (e.g., semiconductor device 200a or 200b, which will be described later), and the method 10 includes steps S11, S13, S15, S17, S19, S21, S23, S25, and S27, in accordance with some embodiments.

The steps S11 to S27 of FIG. 5 are first introduced briefly and then elaborated in connection with the following figures. As shown in FIG. 5, the method 10 begins at step S11 where an integrated circuit (IC) die having a bond pad is provided. In some embodiments, the IC die has a plurality of bond pads thereon, and the bond pads includes aluminum (Al). At step S13, a first dielectric layer, a second dielectric layer and a first photoresist layer are sequentially formed over the bond pad. Next, at step S15, the first photoresist layer is patterned. In some embodiments, an opening is formed in the first photoresist layer after the first photoresist layer is patterned.

Subsequently, at step S17, the first dielectric layer and the second dielectric layer are etched using the first photoresist layer as a mask. In some embodiments, the opening in the first photoresist layer is transferred to the first dielectric layer and the second dielectric layer to form an opening (also referred to as a first opening) exposing a top surface area of the bond pad. At step S19, a second photoresist layer is formed over the first photoresist layer. Next, at step S21, the second photoresist layer is patterned. In some embodiments, an opening (also referred to as a second opening) is formed in the second photoresist layer after the second photoresist layer is patterned, and the top surface area of the bond pad exposed by the first opening is partially exposed by the second opening. In some embodiments, the sidewalls of the first photoresist layer, the sidewalls of the second dielectric layer and the sidewalls of the first dielectric layer exposed by the first opening are covered by the second photoresist layer after the second photoresist layer is patterned.

At step S23, the bond pad is etched using the second photoresist layer as a mask to form a recess (also referred to as a concave depression). In some embodiments, the recess does not penetrate through the bond pad. Then, at step S25, the second photoresist layer is removed. Next, at step S27, a wire bond is bonded to the recess of the bond pad. In some embodiments, a maximum width of the recess is greater than or equal to a maximum width of the wire bond in a cross-sectional view. In some embodiments, the footprint of the recess is greater than or equal to the footprint of the wire bond. After the bonding process is performed, the semiconductor device (e.g., the semiconductor device 200a or 200b) is obtained.

Figure 12:
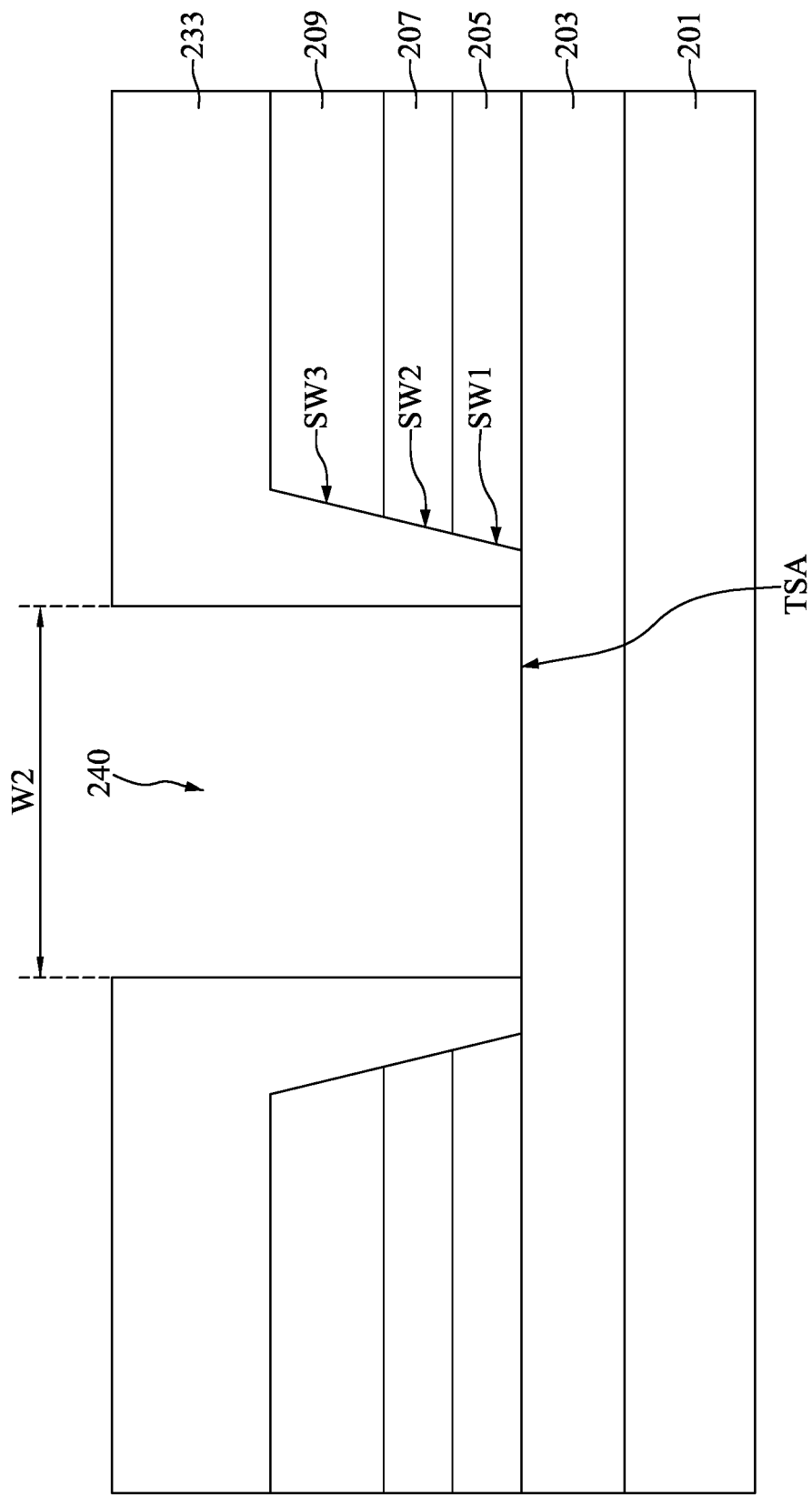
FIG. 12 is a cross-sectional view illustrating an intermediate stage of patterning the second photoresist layer during the formation of the semiconductor device according to various embodiments of the present disclosure.
Figure 13:
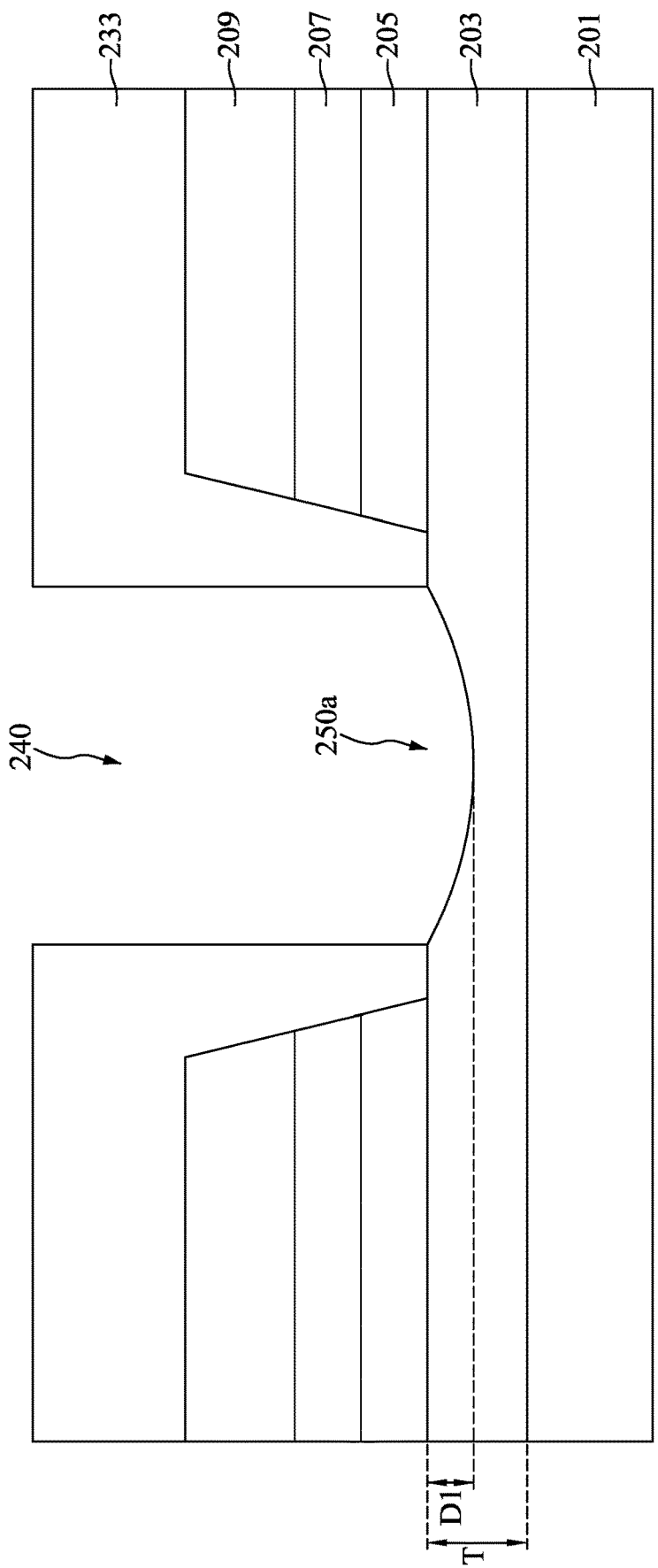
FIG. 13 is a cross-sectional view illustrating an intermediate stage of etching the bond pad to form a recess during the formation of the semiconductor device according to various embodiments of the present disclosure.
Figure 14:
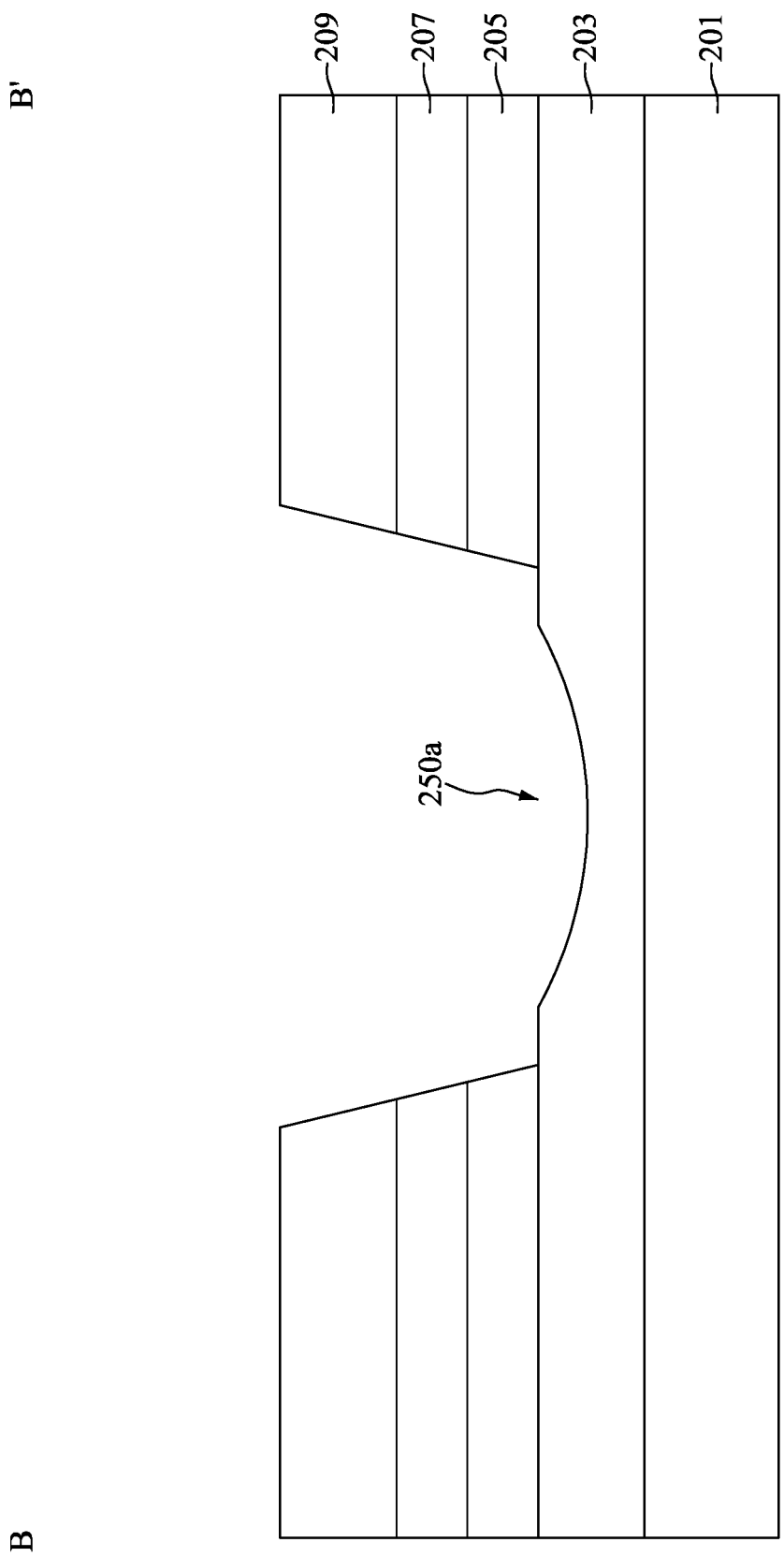
FIG. 14 is a cross-sectional view illustrating an intermediate stage of removing the second photoresist layer during the formation of the semiconductor device according to various embodiments of the present disclosure.
Figure 15:
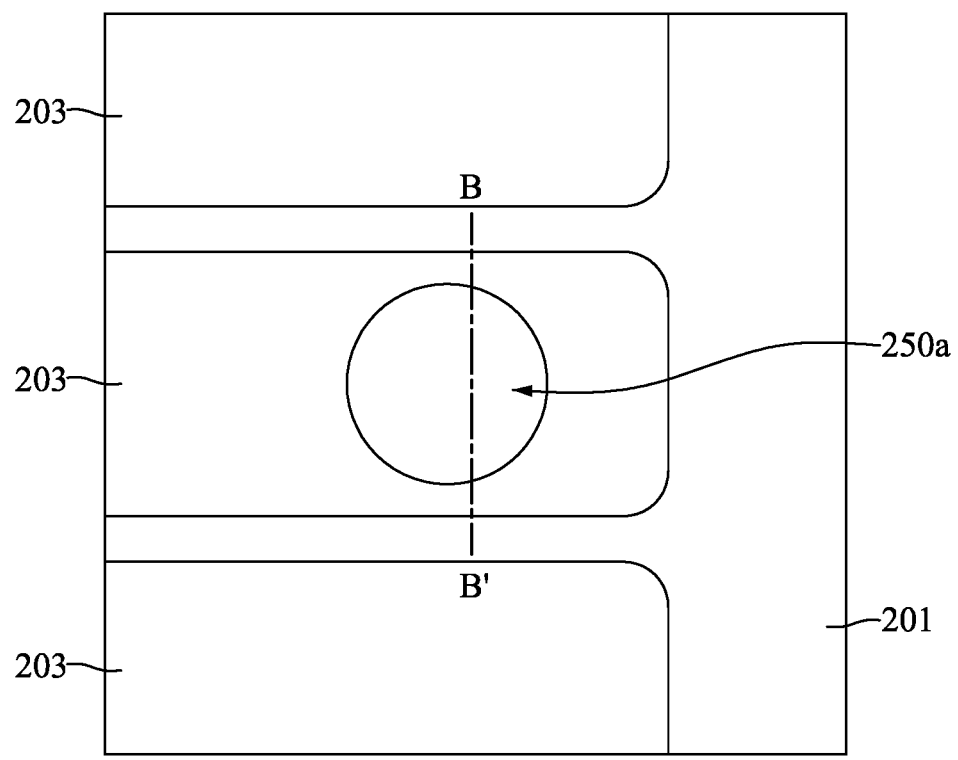
Figure 16:
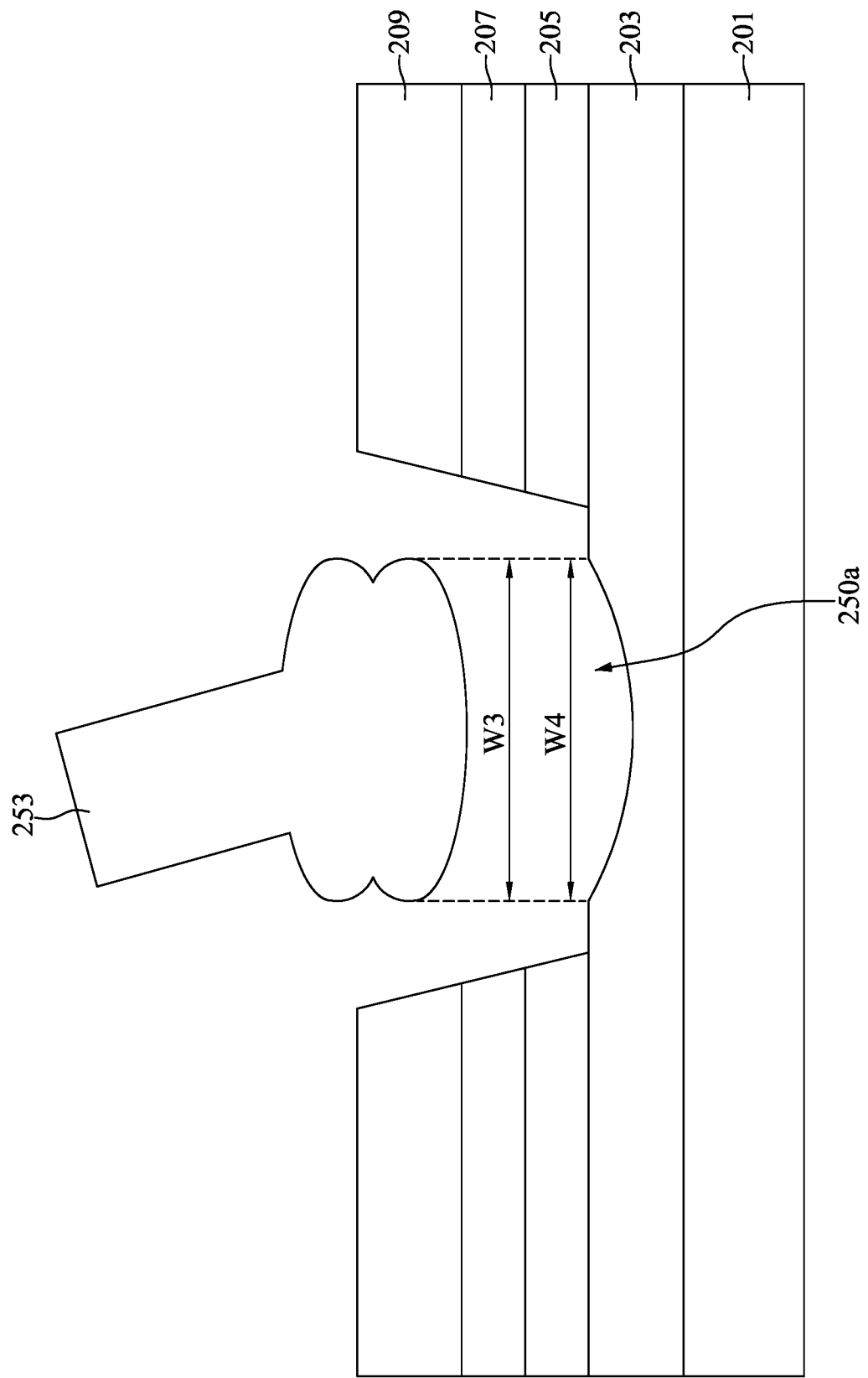
FIG. 16 is a cross-sectional view illustrating an intermediate stage of aligning a wire bond to the recess of the bond pad during the formation of the semiconductor device according to various embodiments of the present disclosure.
Figure 17:
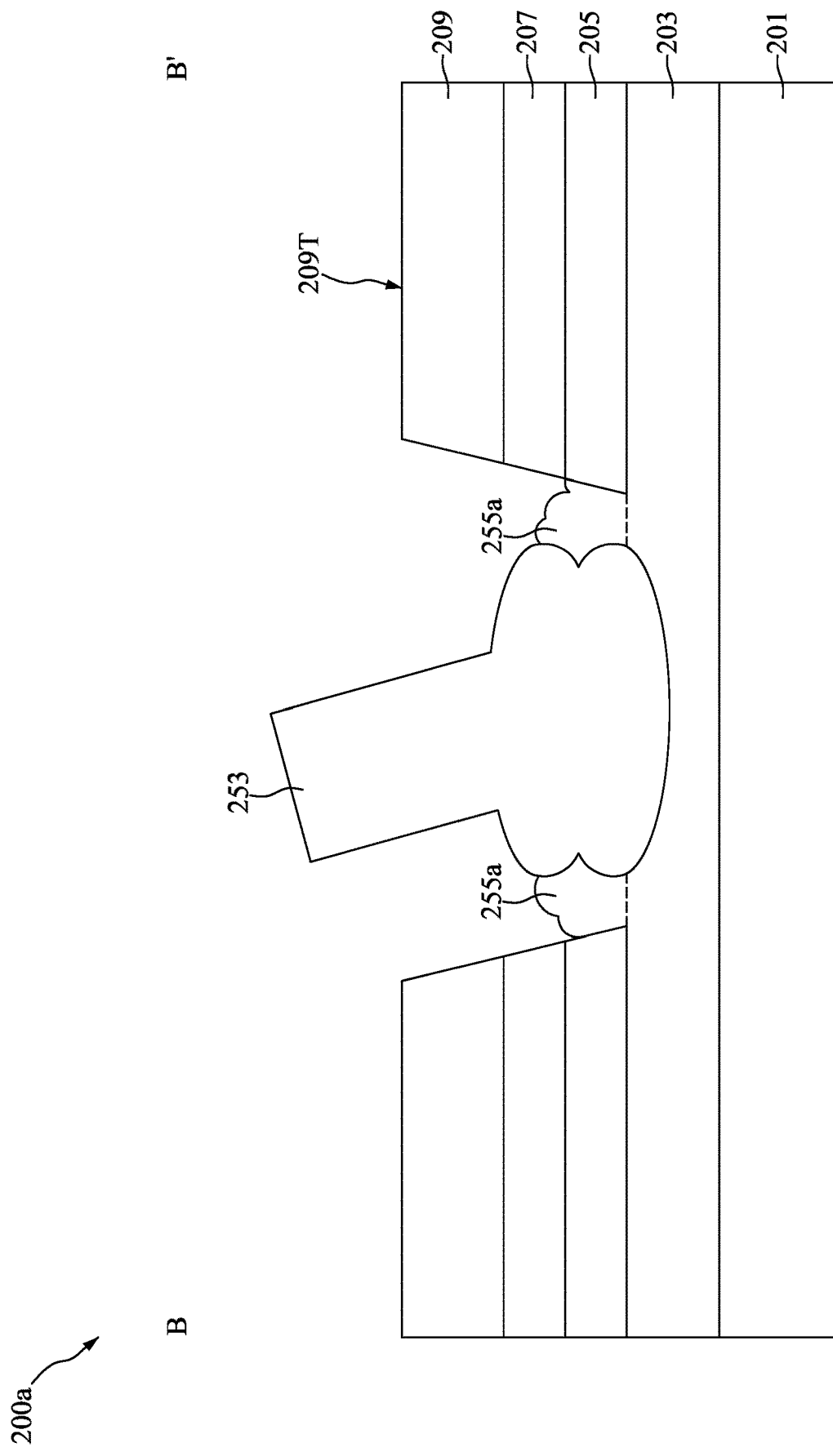
FIG. 17 is a cross-sectional view illustrating an intermediate stage of bonding the wire bond to the recess during the formation of the semiconductor device according to various embodiments of the present disclosure.
Figure 18:
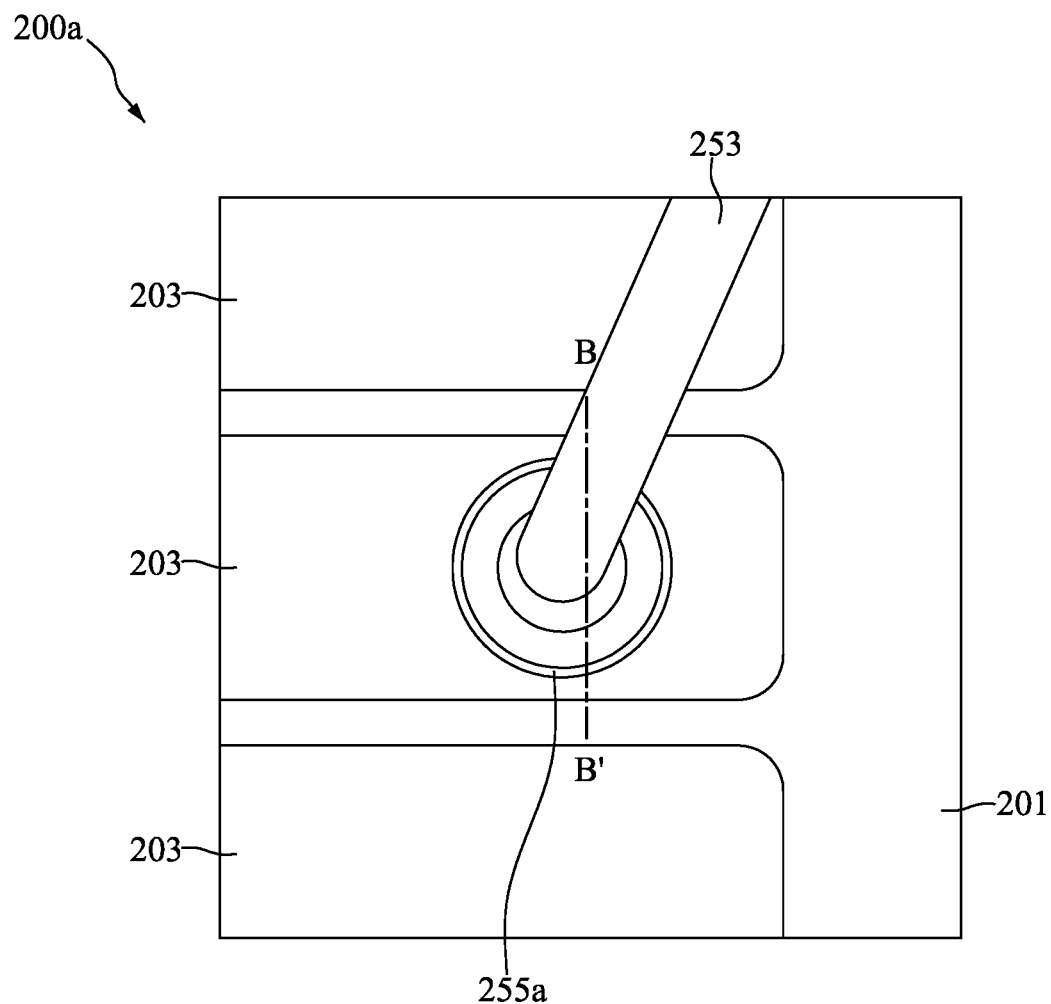

FIGS. 6-14, 16 and 17 are cross-sectional views illustrating various stages of forming the semiconductor device 200a by the method 10 of FIG. 5 according to various embodiments of the present disclosure. FIGS. 15 and 18 are partial top views illustrating the structures of FIGS. 14 and 17, respectively, according to various embodiments of the present disclosure. FIG. 14 is taken along line B-B' in FIG. 15, and FIG. 17 is taken along line B-B' in FIG. 18. Note that some layers shown in FIGS. 14 and 17 are not shown in the top views of FIGS. 15 and 18 in order to simplify the drawings.

Figure 6:
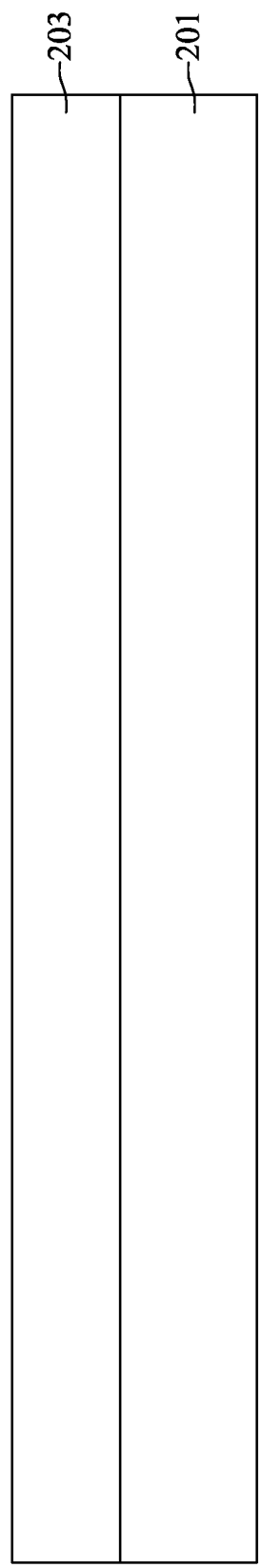
FIG. 6 is a cross-sectional view illustrating an intermediate stage of providing an integrated circuit die having a bond pad during the formation of a semiconductor device according to various embodiments of the present disclosure.

As shown in FIG. 6, an integrated circuit (IC) die 201 having a bond pad 203 is provided. The IC die 201 may be a portion of an IC chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the IC die 201 may include various material layers (e.g., dielectric layers, semiconductor layers, and/or conductive layers) configured to form IC features (e.g., doped regions, isolation features, gate features, source/drain features, interconnect features, other features, or combinations thereof). For example, the bond pad 203 over the IC die 201 is electrically connected to the conductive layers within the IC die 201. The IC die 201 has been simplified for the sake of clarity. It should be noted that additional features can be added in the IC die 201, and some of the features described below can be replaced, modified, or eliminated in other embodiments.

In some embodiments, the bond pad 203 includes aluminum (Al). In addition, the IC die 201 has more than one bond pad, and the materials of these bond pads include aluminum (Al), in accordance with some embodiments.

Figure 7:
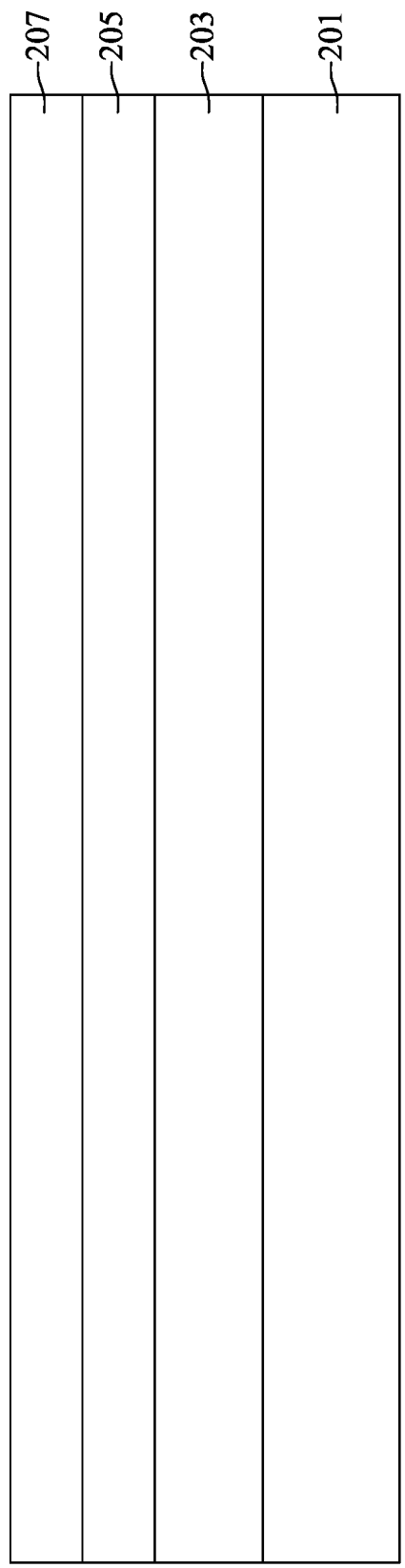
FIG. 7 is a cross-sectional view illustrating an intermediate stage of forming a first dielectric layer and a second dielectric layer over the bond pad during the formation of the semiconductor device according to various embodiments of the present disclosure.

Next, a first dielectric layer 205 is formed over the IC die 201 and covering the bond pad 203, and a second dielectric layer 207 is formed over the first dielectric layer 205, as shown in FIG. 7 in accordance with some embodiments. The respective step is illustrated as the step S13 in the method 10 shown in FIG. 5. The first dielectric layer 205 and the second dielectric layer 207 may be made of silicon oxide, silicon nitride, silicon oxynitride, other suitable materials, and/or combinations thereof.

In some embodiments, the first dielectric layer 205 is made of an oxide (e.g., silicon oxide), and the second dielectric layer 207 is made of a nitride (e.g., silicon nitride). Moreover, the first dielectric layer 205 and the second dielectric layer 207 may be formed by deposition processes. The deposition processes may include chemical vapor deposition (CVD), physical vapor deposition (PVD), atomic layer deposition (ALD), high density plasma CVD (HDPCVD), metal organic CVD (MOCVD), plasma enhanced CVD (PECVD), other suitable methods, and/or combinations thereof.

Figure 8:
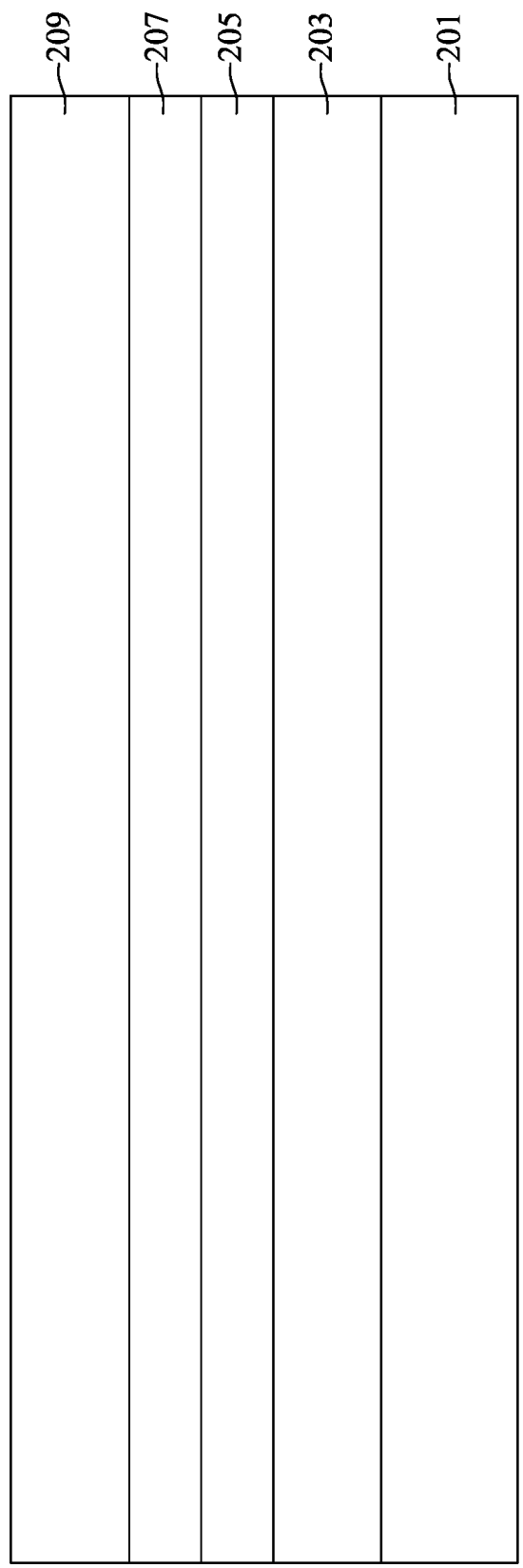
FIG. 8 is a cross-sectional view illustrating an intermediate stage of forming a first photoresist layer over the second dielectric layer during the formation of the semiconductor device according to various embodiments of the present disclosure.

Then, a first photoresist layer 209 is formed over the second dielectric layer 207, as shown in FIG. 8 in accordance with some embodiments. The respective step is illustrated as the step S13 in the method 10 shown in FIG. 5. The first photoresist layer 209 includes a photosensitive material that causes the first photoresist layer 209 to undergo a property change when exposed to light, such as ultraviolet (UV) light, deep ultraviolet (DUV) light or extreme ultraviolet (EUV) light. In some embodiments, the first photoresist layer 209 is made of polyimide (PI), such as polyimide-iso-indroquinazalinedione (PIQ). The first photoresist layer 209 may be formed over the second dielectric layer 207 by a spin coating process.

Figure 9:
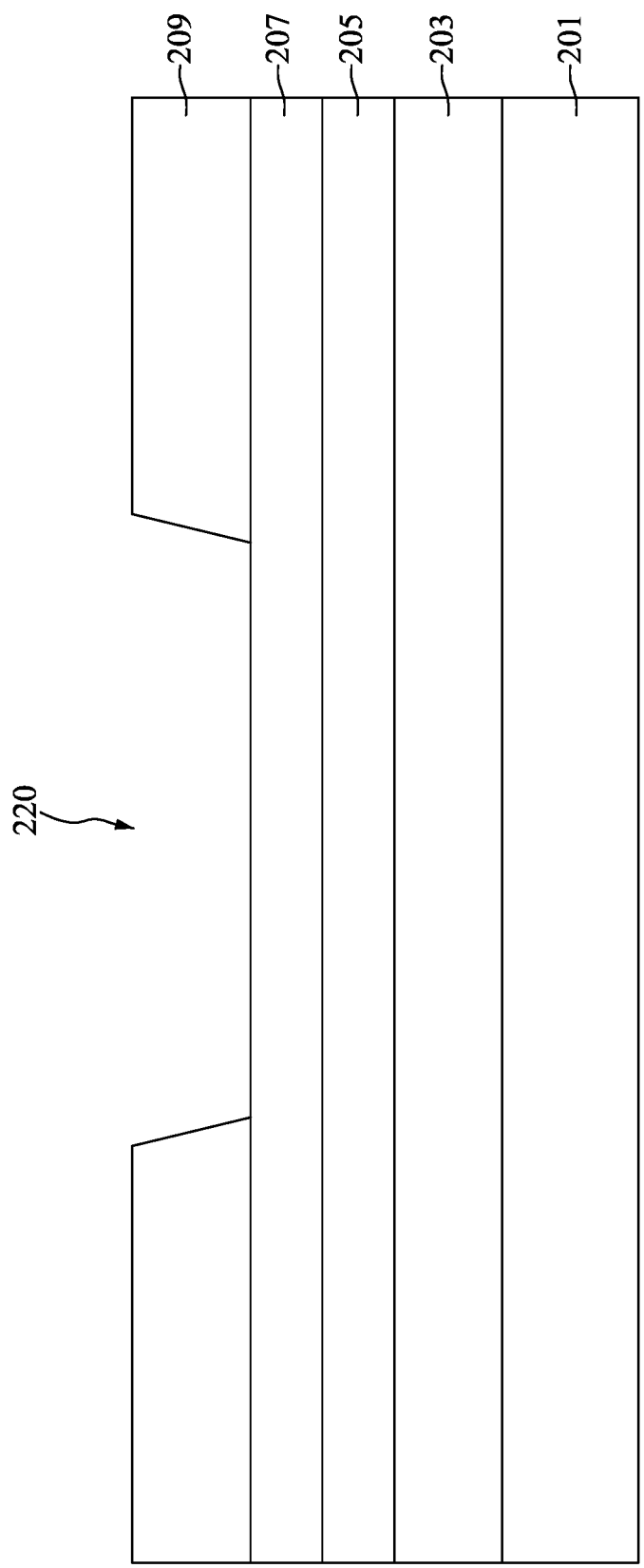
FIG. 9 is a cross-sectional view illustrating an intermediate stage of patterning the first photoresist layer during the formation of the semiconductor device according to various embodiments of the present disclosure.

The first photoresist layer 209 is patterned to form an opening 220 exposing the second dielectric layer 207, as shown in FIG. 9 in accordance with some embodiments. The respective step is illustrated as the step S15 in the method 10 shown in FIG. 5. In some embodiments, the patterning process of the first photoresist layer 209 includes exposing the first photoresist layer 209 to a light source, and developing the first photoresist layer 209 to remove exposed or unexposed portions depending upon the tone of the first photoresist layer 209. The first photoresist layer 209 may be a positive tone photoresist or a negative tone photoresist.

Figure 10:
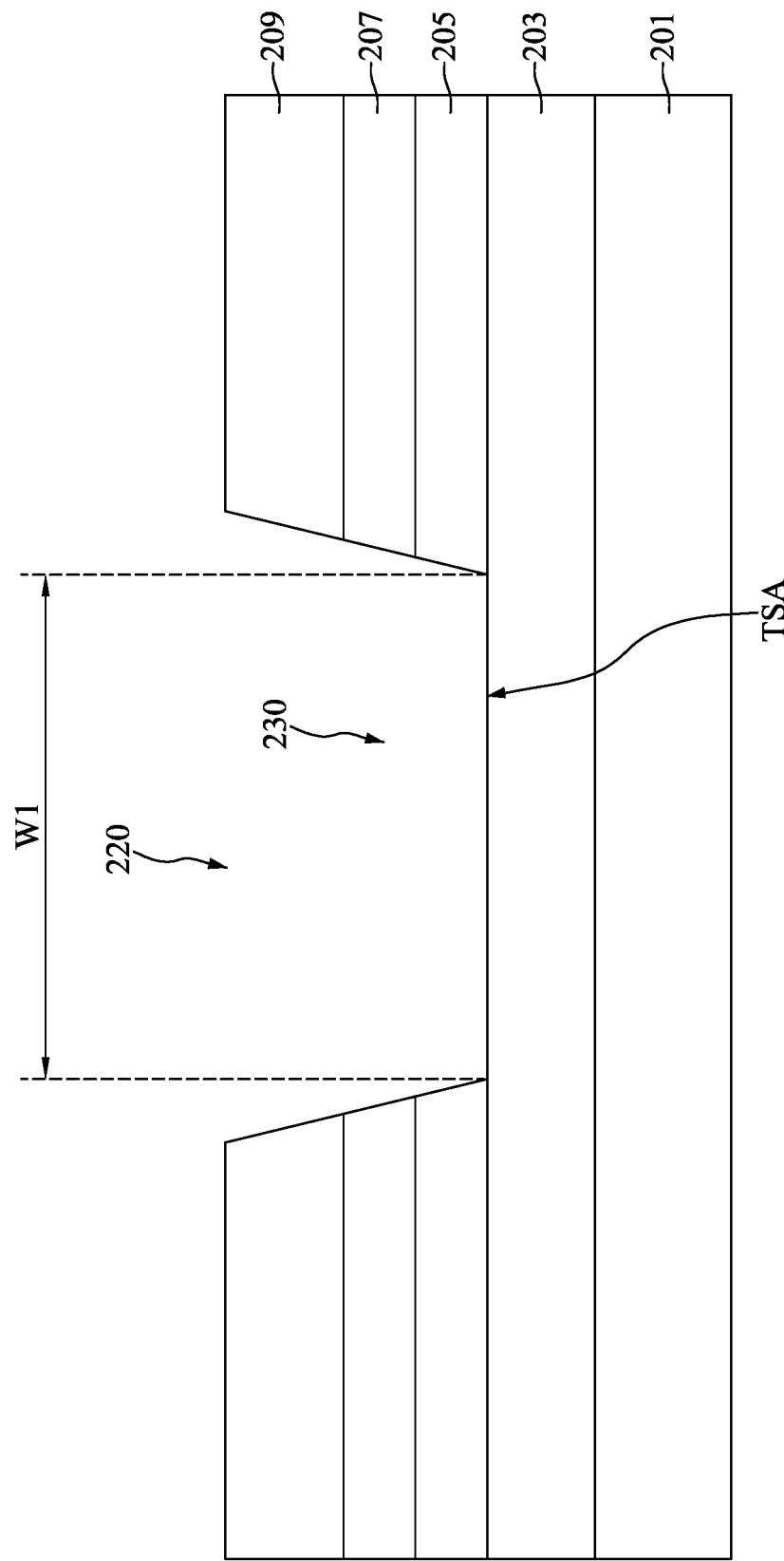
FIG. 10 is a cross-sectional view illustrating an intermediate stage of etching the first dielectric layer and the second dielectric layer to partially expose the bond pad during the formation of the semiconductor device according to various embodiments of the present disclosure.

After the first photoresist layer 209 is patterned, the first dielectric layer 205 and the second dielectric layer 207 are etched using the first photoresist layer 209 as a mask, as shown in FIG. 10 in accordance with some embodiments. The respective step is illustrated as the step S17 in the method 10 shown in FIG. 5. In some embodiments, the etching process performed on the first dielectric layer 205 and the second dielectric layer 207 includes a dry etching process, a wet etching process, or a combination thereof.

In some embodiments, the opening 220 in the first photoresist layer 209 is transferred to the first dielectric layer 205 and the second dielectric layer 207 by the etching process, such that an opening 230 (also referred to as a first opening) is formed penetrating through the first dielectric layer 205 and the second dielectric layer 207. In some embodiments, a top surface area TSA of the bond pad 203 is exposed by the first opening 230. In some embodiments, the first opening 230 has a bottom width W1 in the cross-sectional view shown in FIG. 10.

Figure 11:
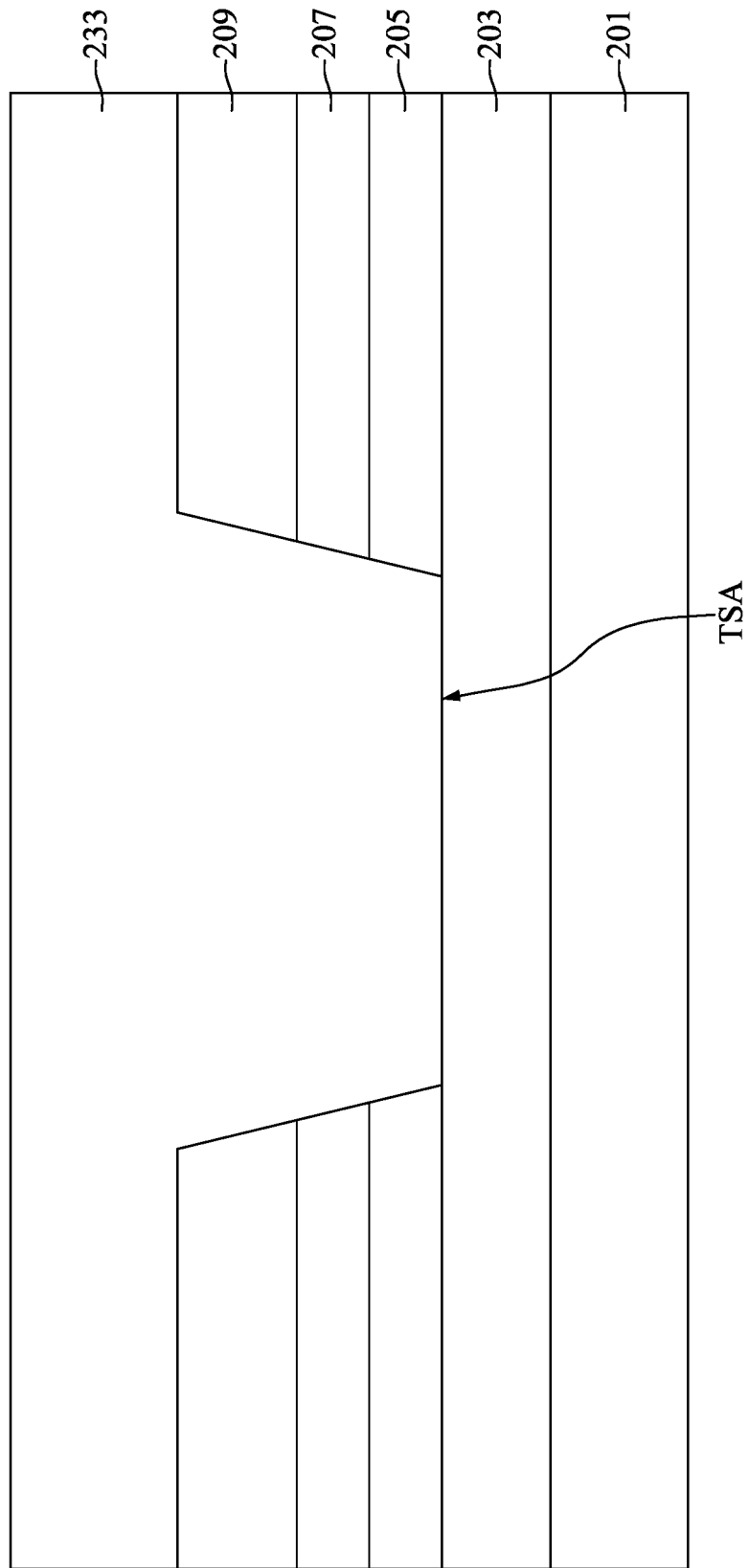
FIG. 11 is a cross-sectional view illustrating an intermediate stage of forming a second photoresist layer over the first photoresist layer during the formation of the semiconductor device according to various embodiments of the present disclosure.

Subsequently, a second photoresist layer 233 is formed over the first photoresist layer 209, as shown in FIG. 11 in accordance with some embodiments. The respective step is illustrated as the step S19 in the method 10 shown in FIG. 5. In some embodiments, the top surface area TSA of the bond pad 203 exposed by the first opening 230 is covered by the second photoresist layer 233.

At this stage, the opening 220 in the first photoresist layer 209 and the opening 230 in the first dielectric layer 205 and the second dielectric layer 207 are filled by the second photoresist layer 233. Some materials and processes used to form the second photoresist layer 233 are similar to, or the same as those used to form the first photoresist layer 209, and details thereof are not repeated herein. In some embodiments, the first photoresist layer 209 and the second photoresist layer 233 are made of different materials to have etching selectivity during subsequent removal process.

The second photoresist layer 233 is then patterned to form an opening 240 (also referred to as a second opening) partially exposing the top surface area TSA of the bond pad 203 previously exposed by the first opening 230 (see FIG. 10), as shown in FIG. 12 in accordance with some embodiments. The respective step is illustrated as the step S21 in the method 10 shown in FIG. 5. Some processes used to pattern the second photoresist layer 233 are similar to, or the same as those used to pattern the first photoresist layer 209, and details thereof are not repeated herein.

In some embodiments, after the second photoresist layer 233 is patterned, a first portion of the top surface area TSA of the bond pad 203 is exposed by the second opening 240, while a second portion of the top surface area TSA of the bond pad 203 remains covered by the second photoresist layer 233. In some embodiments, the second opening 240 has a bottom width W2 in the cross-sectional view shown in FIG. 12, and the bottom width W2 of the second opening 240 is less than the bottom width W1 of the first opening 230 (see FIG. 10).

In some embodiments, the area of the bond pad 203 exposed by the first opening 230 is greater than the area of the bond pad 203 exposed by the second opening 240. Moreover, the sidewalls SW1 of the first dielectric layer 205, the sidewalls SW2 of the second dielectric layer 207, and the sidewalls SW3 of the first photoresist layer 209 previously exposed by the first opening 230 are covered by the second photoresist layer 233 after the second photoresist layer 233 is patterned, in accordance with some embodiments.

Next, the bond pad 203 is etched using the second photoresist layer 233 as a mask, such that a recess 250a is formed under the second opening 240, as shown in FIG. 13 in accordance with some embodiments. The respective step is illustrated as the step S23 in the method 10 shown in FIG. 5. In some embodiments, the etching process for forming the recess 250a includes a dry etching process, a wet etching process, or a combination thereof.

In some embodiments, a top portion of the bond pad 203 is removed during the etching process for forming the recess 250a. That is, the bond pad 203 is not etched through, and the etching process is stopped at an intermediate level between the top surface and the bottom surface of the bond pad 203. In some embodiments, a maximum depth D1 of the recess 250a is less than or equal to half of a thickness T of the bond pad 203.

After the recess 250a is formed in the bond pad 203, the second photoresist layer 233 is removed, as shown in FIG. 14 in accordance with some embodiments. The respective step is illustrated as the step S25 in the method 10 shown in FIG. 5. In some embodiments, the second photoresist layer 233 is removed by a stripping process, an ashing process, or another suitable process.

FIG. 15 is a partial top view illustrating the structure of FIG. 14, and FIG. 14 is taken along line B-B' in FIG. 15. Note that the first dielectric layer 205, the second dielectric layer 207 and the first photoresist layer 209 are not shown in FIG. 15 in order to simplify the drawing. FIG. 15 shows the location of the recess 250a from the top view. Although only one recess 250a is illustrated in FIG. 15, it is understood that similar recesses can be formed in the adjacent bond pads 203.

After the second photoresist layer 233 is removed, a wire bond 253 is aligned to the recess 250a of the bond pad 203, as shown in FIG. 16 in accordance with some embodiments. In some embodiments, the wire bond 253 includes copper (Cu). As shown in the cross-sectional view of FIG. 16, the wire bond 253 has a maximum width W3, and the recess 250a in the bond pad 203 has a maximum width W4 parallel to the maximum width W3 of the wire bond 253. In some embodiments, the maximum width W4 of the recess 250a in the bond pad 203 is substantially equal to the maximum width W3 of the wire bond 253. Within the context of this disclosure, the word "substantially" means preferably at least 90%, more preferably 95%, even more preferably 98%, and most preferably 99%. In some embodiments, the footprint of the recess 250a is substantially equal to the footprint of the wire bond 253 from the top view.

Subsequently, the wire bond 253 is bonded to the recess 250a, as shown in FIG. 17 in accordance with some embodiments. The respective step is illustrated as the step S27 in the method 10 shown in FIG. 5. After the wire bond 253 is bonded to the bond pad 203, the semiconductor device 200a is obtained.

In some embodiments, a splash 255a is formed around the wire bond 253 and in the opening 230 (see FIG. 10) during the bonding process. As mentioned above, the splash 255a is formed from the material of the bond pad 203 (e.g., aluminum (Al)). It should be noted that, the splash 255a does not extend above the top surface 209T of the first photoresist layer 209, in accordance with some embodiments.

In order to reserve capacity for the splash 255a (e.g., Al splash) formed during the bonding process, the top portion of the bond pad 203 is etched to form the recess 250a, in accordance with some embodiments. Therefore, the splash 255a can be controlled within the opening 230 (or within the openings 230 and 220, see FIG. 10), which prevents short circuiting between adjacent bond pads 203. This provides more margin for the bonding process. As a result, the size of the bond pads 203 can be reduced, which creates more room for chip design, therefore, reduces chip sizes.

FIG. 18 is a partial top view illustrating the structure of FIG. 17, and FIG. 17 is taken along line B-B' in FIG. 18. Note that the first dielectric layer 205, the second dielectric layer 207 and the first photoresist layer 209 are not shown in FIG. 18 in order to simplify the drawing. FIG. 18 shows the wire bond 253 and the splash 255a from the top view. Although only one wire bond 253 and one splash 255a are illustrated in FIG. 18, it is understood that similar wire bonds can be bonded to the adjacent bond pads 203, and similar splash profiles can be formed around the wire bonds bonded to the adjacent bond pads 203.

Figure 19:
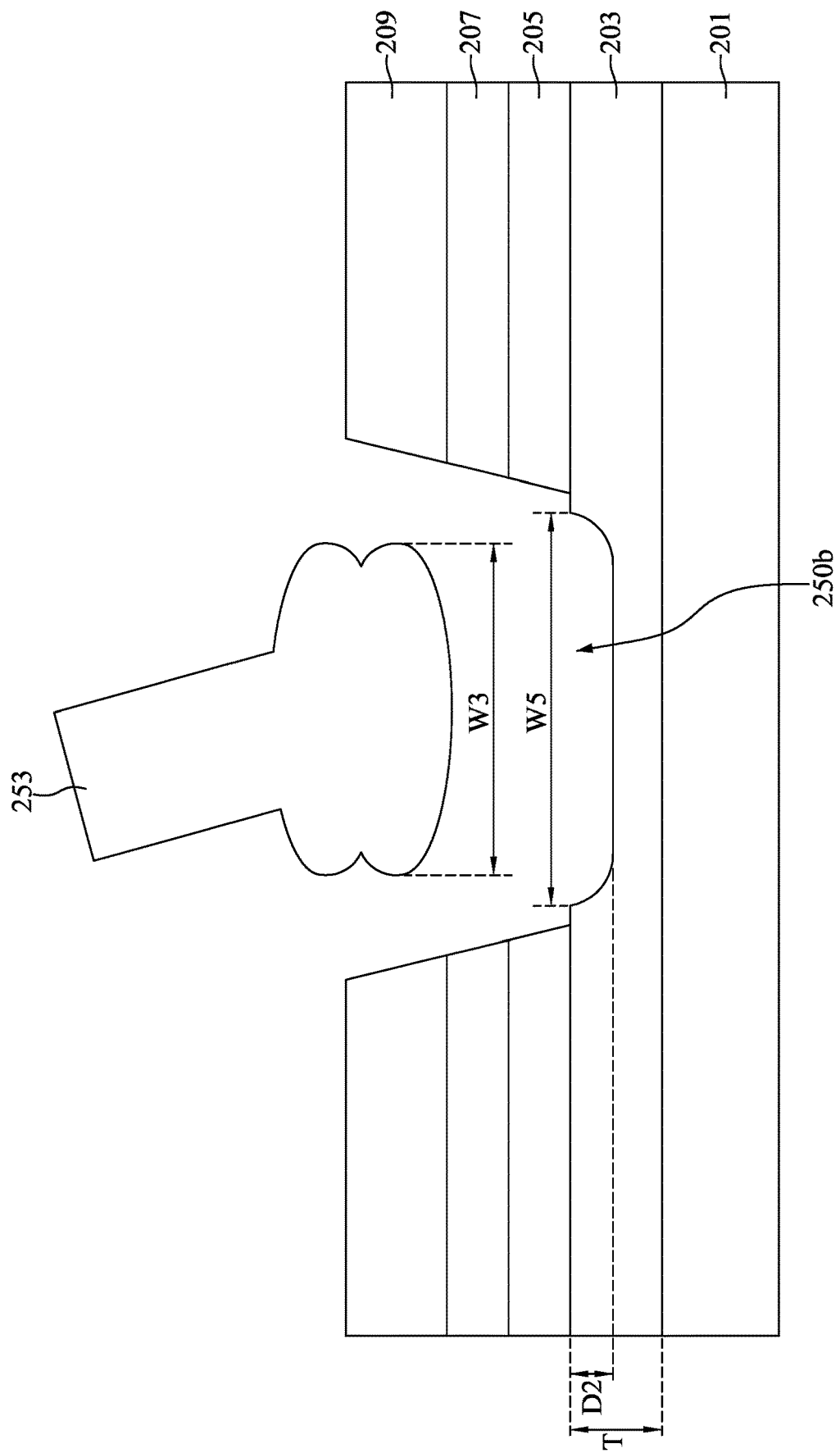
FIG. 19 is a cross-sectional view illustrating an intermediate stage of aligning a wire bond to a recess of the bond pad during the formation of a modified semiconductor device according to various embodiments of the present disclosure.
Figure 20:
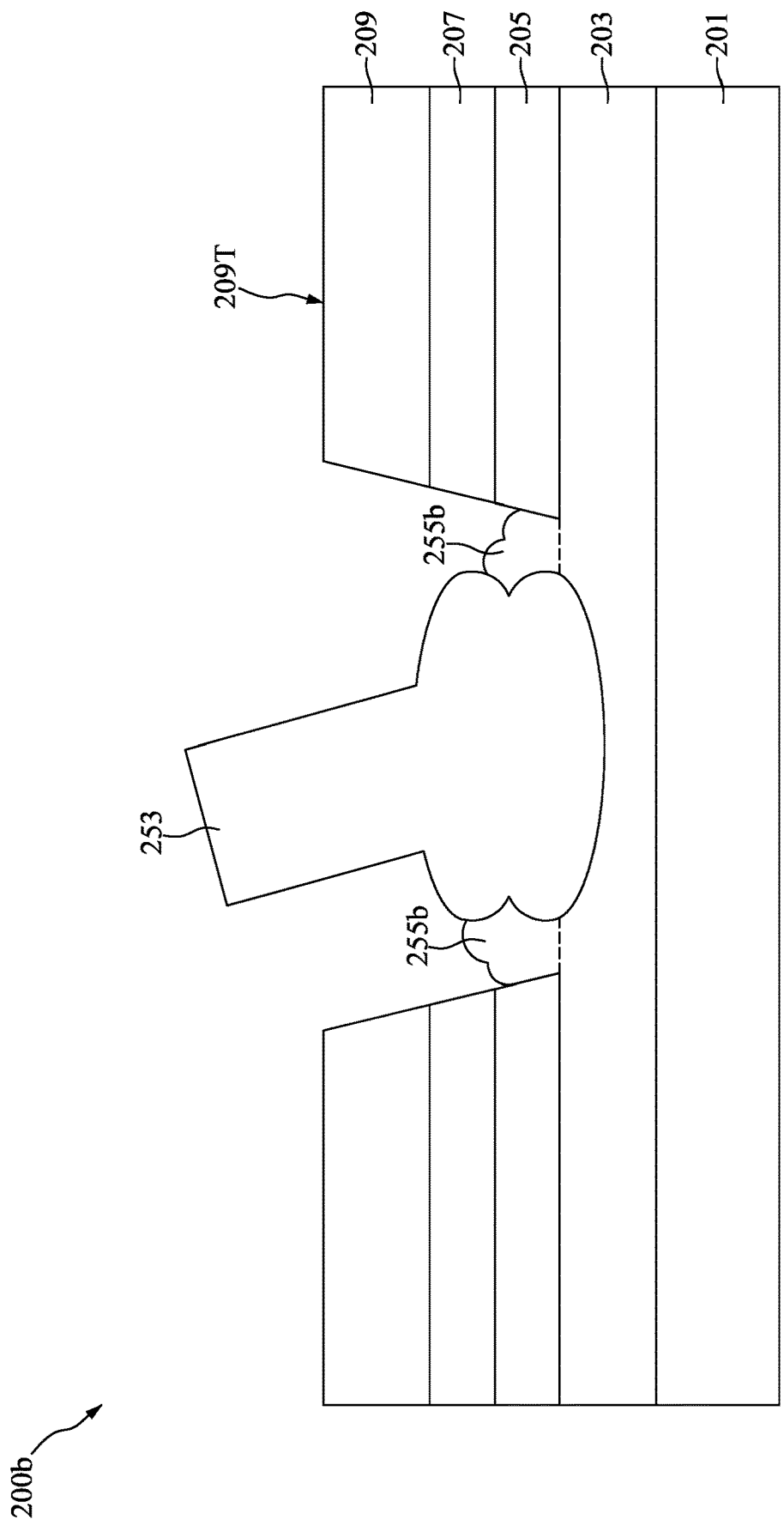
FIG. 20 is a cross-sectional view illustrating an intermediate stage of bonding the wire bond to the recess during the formation of the modified semiconductor device according to various embodiments of the present disclosure.

FIGS. 19 and 20 are cross-sectional views illustrating various stages of forming the modified semiconductor device 200b by the method 10 of FIG. 5 according to various embodiments of the present disclosure. As shown in FIG. 19, after the second photoresist layer 233 is removed, the wire bond 253 is aligned to the recess 250b of the bond pad 203, in accordance with some embodiments.

It should be noted that the arrangement, material and forming method of the structure shown in FIG. 19 are similar to the arrangement, material and forming method of the structure shown in FIG. 16. Thus, details thereof are omitted herein. A difference between the structures of FIGS. 16 and 19 lies in that a maximum width W5 of the recess 250b formed in the bond pad 203 shown in FIG. 19 is greater than the maximum width W4 of the recess 250a formed in the bond pad 203 shown in FIG. 16, in accordance with some embodiments. That is, in the cross-sectional view of FIG. 19, the maximum width W5 of the recess 250b is greater than the maximum width W3 of the wire bond 253.

In some embodiments, the footprint of the recess 250b is greater than the footprint of the wire bond 253 from the top view. In addition, similar to the structure shown in FIG. 16, a maximum depth D2 of the recess 250b is less than or equal to half of the thickness T of the bond pad 203.

Subsequently, the wire bond 253 is bonded to the recess 250b, as shown in FIG. 20 in accordance with some embodiments. The respective step is illustrated as the step S27 in the method 10 shown in FIG. 5. After the wire bond 253 is bonded to the bond pad 203, the semiconductor device 200b is obtained.

In some embodiments, a splash 255b is formed around the wire bond 253 and in the opening 230 (see FIG. 10) during the bonding process. As mentioned above, the splash 255b is formed from the material of the bond pad 203 (e.g., aluminum (Al)). It should be noted that, the splash 255b does not extend above the top surface 209T of the first photoresist layer 209, in accordance with some embodiments.

In order to reserve capacity for the splash 255b (e.g., Al splash) formed during the bonding process, the top portion of the bond pad 203 is etched to form the recess 250b, in accordance with some embodiments. Therefore, the splash 255b can be controlled within the opening 230 (or within the openings 230 and 220, see FIG. 10), which prevents short circuiting between adjacent bond pads 203. This provides more margin for the bonding process. As a result, the size of the bond pads 203 can be reduced, which creates more room for chip design, therefore, reduces chip sizes.

Embodiments of the method for preparing a semiconductor device with a wire bond are provided in the disclosure. The method includes providing an integrated circuit die (e.g., the integrated circuit die 201) having a bond pad (e.g., the bond pad 203), etching a top portion of the bond pad to form a recess (e.g., the recess 250a or 250b), and bonding a wire bond (e.g., the wire bond 253) to the recess. In some embodiments, the material of the bond pad includes aluminum (Al), and the material of the wire bond includes copper (Cu).

Since the bond pad is partially etched to reserve capacity for the splash formed during the bonding process, the splash may be controlled in the bond pad opening and may be prevented from electrically connecting with adjacent bond pads. For example, the splashes formed over adjacent bond pads during the bonding process may be physically connected together. By etching the top portion of the bond pad to form the recess before the bonding process, more margin for the bonding process may be provided. As a result, the size of the bond pads can be reduced, which creates more room for chip design, therefore, reduces chip sizes.

In one embodiment of the present disclosure, a method for preparing a semiconductor device is provided. The method includes providing an integrated circuit die having a bond pad. The bond pad includes aluminum (Al). The method also includes etching a top portion of the bond pad to form a recess, and bonding a wire bond to the recess in the bond pad. The wire bond includes copper (Cu).

In another embodiment of the present disclosure, a method for preparing a semiconductor device is provided. The method includes providing an integrated circuit die having a bond pad, and forming a first dielectric layer over the bond pad. The method also includes forming a second dielectric layer over the first dielectric layer, and etching the first dielectric layer and the second dielectric layer to form a first opening exposing a top surface area of the bond pad. The method further includes partially recessing the top surface area of the bond pad to form a concave depression, and bonding a wire bond to the concave depression.

In yet another embodiment of the present disclosure, a method for preparing a semiconductor device is provided. The method includes providing an integrated circuit die having a bond pad. The bond pad includes aluminum (Al). The method also includes forming a first dielectric layer over the bond pad, and forming a second dielectric layer over the first dielectric layer. The method further includes forming a first photoresist layer over the second dielectric layer, and etching the first dielectric layer and the second dielectric layer using the first photoresist layer as a mask to form an opening. In addition, the method includes forming a second photoresist layer over the first photoresist layer and extending into the opening, and etching the bond pad using the second photoresist layer as a mask to form a recess. The method also includes performing a bonding process to bond a wire bond to the recess of the bond pad. The wire bond includes copper (Cu).

The embodiments of the present disclosure have some advantageous features. By etching the top portion of the bond pad to form the recess before the wire bond is bonded to the bond pad, more margin for the bonding process may be provided. As a result, the size of the bond pads can be reduced, which creates more room for chip design, therefore, reduces chip sizes Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
   providing an integrated circuit die having a bond pad, wherein the bond pad includes aluminum (Al);
   forming a first dielectric layer over the bond pad;
   forming a second dielectric layer over the first dielectric layer;
   forming a first photoresist layer over the second dielectric layer;
   etching the first dielectric layer and the second dielectric layer using the first photoresist layer as a mask to form an opening which is a through opening penetrating through the first dielectric layer and the second dielectric layer;
   forming a second photoresist layer over the first photoresist layer and extending into the opening;
   etching the bond pad using the second photoresist layer as a mask to form a recess; and
   performing a bonding process to bond a wire bond to the recess of the bond pad, wherein the wire bond includes copper (Cu);
   wherein a splash is formed around the wire bond and in the opening during the bonding process.

2. The method for preparing a semiconductor device of claim 1, wherein a top surface area of the bond pad exposed by the opening is partially covered by the second photoresist layer.

3. The method for preparing a semiconductor device of claim 1, further comprising:
   removing the second photoresist layer before the wire bond is bonded to the recess.

4. The method for preparing a semiconductor device of claim 1, wherein a depth of the recess is less than a thickness of the bond pad.

5. The method for preparing a semiconductor device of claim 4, wherein the splash is formed from the bond pad.

6. The method for preparing a semiconductor device of claim 4, wherein the splash does not extend above a top surface of the first photoresist layer.

* * * * *